US008722453B2

(12) United States Patent
Nakatani (10) Patent No.: US 8,722,453 B2
(45) Date of Patent: May 13, 2014

(54) PHOTOVOLTAIC DEVICE AND METHOD FOR MANUFACTURING THE SAME

(75) Inventor: Mitsunori Nakatani, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 0 days.

(21) Appl. No.: 13/259,079

(22) PCT Filed: Apr. 14, 2009

(86) PCT No.: PCT/JP2009/057517
§ 371 (c)(1),
(2), (4) Date: Sep. 22, 2011

(87) PCT Pub. No.: WO2010/119512
PCT Pub. Date: Oct. 21, 2010

(65) Prior Publication Data
US 2012/0017986 A1    Jan. 26, 2012

(51) Int. Cl.
*H01L 21/00* (2006.01)
(52) U.S. Cl.
USPC ............ 438/98; 438/57; 438/83; 257/431; 257/E25.004; 257/E25.007; 136/252; 136/256
(58) Field of Classification Search
USPC ............... 438/83, 98, 57; 136/252, 256; 257/E25.007, E25.004, 431
See application file for complete search history.

(56) References Cited
U.S. PATENT DOCUMENTS 6,071,753 A * 6/2000 Arimoto ................. 438/57
6,462,266 B1 * 10/2002 Kurth ...................... 136/251
2004/0097062 A1 * 5/2004 Preu et al. ................ 438/597
2006/0130891 A1   6/2006 Carlson
2006/0283499 A1   12/2006 Terakawa et al.
2008/0202576 A1 * 8/2008 Hieslmair ............... 136/244
(Continued)

FOREIGN PATENT DOCUMENTS

JP    5-055612 A    3/1993
JP    5-095127 A    4/1993
(Continued)

OTHER PUBLICATIONS

Office Action (Notice of Rejection) dated Oct. 16, 2012, issued in corresponding Japanese Patent Application No. 2011-509112, and an English Translation thereof. (6 pages).
(Continued)

*Primary Examiner* — Brook Kebede
*Assistant Examiner* — Maria Ligai
(74) *Attorney, Agent, or Firm* — Buchanan Ingersoll Rooney PC (57) ABSTRACT

The method includes: steps of forming an n-type diffusion layer having an n-type impurity diffused thereon at a first surface side of a p-type silicon substrate; forming a reflection prevention film on the n-type diffusion layer; forming a back-surface passivation film made of an SiONH film on a second surface of the silicon substrate; forming a paste material containing silver in a front-surface electrode shape on the reflection prevention film; forming a front surface electrode that is contacted to the n-type diffusion layer by sintering the silicon substrate; forming a paste material containing a metal in a back-surface electrode shape on the back-surface passivation film; and forming a back surface electrode by melting a metal in the paste material by irradiating laser light onto a forming position of the back surface electrode and by solidifying the molten metal.

5 Claims, 6 Drawing Sheets

(56) References Cited

U.S. PATENT DOCUMENTS

| | | | |
|---|---|---|---|
| 2009/0050202 A1 | 2/2009 | Du et al. | |
| 2009/0056798 A1* | 3/2009 | Merchant et al. | 136/256 |
| 2009/0061627 A1 | 3/2009 | Trassl et al. | |
| 2009/0223560 A1* | 9/2009 | Kim | 136/256 |
| 2009/0239331 A1* | 9/2009 | Xu et al. | 438/98 |
| 2010/0069278 A1 | 3/2010 | Licciardi | |
| 2010/0267194 A1 | 10/2010 | Alemán et al. | |

FOREIGN PATENT DOCUMENTS

| | | |
|---|---|---|
| JP | 5-110122 A | 4/1993 |
| JP | 5-315632 A | 11/1993 |
| JP | 11-284212 A | 10/1999 |
| JP | 0 999 598 A1 | 5/2000 |
| JP | 2000-138386 A | 5/2000 |
| JP | 2003-168809 A | 6/2003 |
| JP | 2004-064028 A | 2/2004 |
| JP | 2004-509474 A | 3/2004 |
| JP | 2004-207493 A | 7/2004 |
| JP | 2005-123447 A | 5/2005 |
| JP | 2006-237363 A | 9/2006 |
| JP | 2008-034543 A | 2/2008 |
| JP | 2008-519438 A | 6/2008 |
| JP | 2008-235354 A | 10/2008 |
| JP | 2010-502021 A | 1/2010 |
| WO | WO 2006/129444 A1 | 12/2006 |
| WO | 2008/025392 A1 | 3/2008 |
| WO | 2010092051 A2 | 8/2010 |

OTHER PUBLICATIONS

International Search Report (PCT/ISA/210) issued on May 19, 2009, by Japanese Patent Office as the International Searching Authority for International Application No. PCT/JP2009/057517.

Written Opinion (PCT/ISA/237) issued on May 19, 2009, by Japanese Patent Office as the International Searching Authority for International Application No. PCT/JP2009/057517.

E. Schneiderlochner et al., "Laser-Fired Rear Contacts for Crystalline Silicon Solar Cells", Progress in Photovoltaics: Research and Applications, vol. 10, 2002, pp. 29-34.

Office Action (Notification of the First Office Action) issued on Aug. 5, 2013, by the Chinese Patent Office in corresponding Chinese Patent Application No. 200980158689.8, and an English Translation of the Office Action. (9 pages).

Extended Search Report issued on Oct. 24, 2013 by the European Patent Office, in corresponding European Patent Application No. 09843293.3 (11 pages).

* cited by examiner

PHOTOVOLTAIC DEVICE AND METHOD FOR MANUFACTURING THE SAME

FIELD

The present invention relates to a photovoltaic device and a method for manufacturing the same.

BACKGROUND

An important theme of conventional methods for manufacturing a silicon-crystal solar battery is to reduce the manufacturing cost, and as one of these methods, there has been known a method for forming an electrode by coating a metal paste by a screen printing method and thereafter sintering the metal paste (see, for example, Patent Literature 1). In Patent Literature 1, a paste containing silver as a main component is printed in a comb shape onto a reflection prevention film formed on a light receiving surface of a silicon substrate on which a pn-junction is formed, and the paste is dried. Further, a paste containing aluminum is printed onto an area of a major portion of a back surface of the silicon substrate, and the paste is dried. Thereafter, a paste containing silver is printed at positions where the paste containing aluminum is not printed, and the paste is dried. Thereafter, by sintering, on a front surface of the silicon substrate, front surface electrodes are formed by a fire-through method for conducting printed silver to silicon at a base by penetrating through a reflection prevention film which is insulated. On the back surface of the silicon substrate, as a back surface electrode, back-surface current-collection electrodes are formed at positions where the paste containing aluminum is formed; and back-surface extraction electrodes are formed at the positions where the paste containing silver is formed. At the same time, in a region where the paste containing aluminum is formed, a BSF (Back Surface Field) layer that can prevent recoupling of minority carriers that are generated by light irradiation in the silicon substrate, is formed.

Furthermore, in recent years, a technique for forming a back surface electrode of a solar battery by a method referred to as an LFC (Laser Fired Contact) method has been known (see, for example, Non Patent Literature 1). In this method, an insulation film is formed on the entire back surface of a silicon substrate by a CVD (Chemical Vapor Deposition) method. Further, an aluminum film is deposited on the entire surface of the insulation film, and only a necessary portion is melt by irradiating laser light, thereby forming a back surface electrode; such that aluminum electrodes formed on the entire back surface, are conducted to the silicon substrate at many points; or such that aluminum electrodes formed in a comb shape on the back surface, are conducted to the silicon substrate.

CITATION LIST

Patent Literature

Patent Literature 1: Japanese Patent Application Laid-open No. 2004-207493

Non Patent Literature

Non Patent Literature 1: F. Schneiderlochner, et al., "Laser Fired Rear Contacts for Crystalline Silicon Solar Cells", Progress in Photovoltaics: Research and Applications, Vol. 10, 2002, pp. 29-34.

SUMMARY

Technical Problem

Conditions such as an optimum sintering temperature and a time capable of reducing resistance values of electrodes of a solar battery are usually different between front-surface and back-surface electrodes. Therefore, in the method described in Patent Literature 1, there is no sintering condition for obtaining optimum resistance values for both the front-surface and back-surface of electrodes. Consequently, one of these electrodes has a resistance value that is inferior to an optimum resistance value.

Further, in the method described in Patent Literature 1, aluminum, silver, and an alloy of aluminum and silver are formed by sintering as back surface electrodes. Linear expansion coefficients of these three types of metals are different from each other. Therefore, as these metals are cooled after sintering, a stress is generated due to these different linear expansion coefficients, and back surface electrodes are easily peeled off.

Further, in recent years, a silicon substrate of which cost is a major part of the cost of a solar battery tends to be thinner. A part of infrared rays of sunlight incident from a front surface (a light receiving surface) to a solar battery pass through the silicon substrate, and are transmitted from the back surface electrode to outside, without contributing to power generation. Therefore, it is also important to provide the solar battery with a BSR (Back Surface Reflection) effect to cause the light that reaches the back surface electrode without contributing to power generation to be reflected to the silicon substrate again to contribute to power generation. However, in the method for manufacturing a solar battery by using the LFC method described in Non Patent Literature 1, there is a problem that an electrode material such as Ag, Au, Pt, and Pd having higher reflection rates than that of aluminum and having a high BSR effect, cannot be used.

Further, a technique of improving the conversion efficiency of a silicon-crystal solar battery has been demanded while reducing its manufacturing cost, and even when the substrate thickness becomes smaller and the diffusion length becomes larger than conventional ones in the future, recoupling of minority carriers on the back surface needs to be suppressed.

The present invention has been achieved in view of the above problems, and an object of the present invention is to provide a photovoltaic device that can obtain desired resistance values by front-surface and back-surface electrodes and that can improve conversion efficiency as compared with conventional conversion efficiency even when a substrate thickness becomes smaller than a conventional thickness of a substrate, and to provide a method for manufacturing the photovoltaic device.

Solution to Problem

In order to solve the aforementioned problems and attain the aforementioned object, the method for manufacturing a photovoltaic device is provided with: an impurity-diffusion-layer forming step of forming an impurity diffusion layer having a second conductivity type impurity diffused thereon at a first principal surface side of a first conductivity type silicon substrate; a reflection-prevention-film forming step of forming a reflection prevention film on the impurity diffusion layer; a back-surface passivation-film forming step of forming a back-surface passivation film made of an SiONH film on a second principal surface of the silicon substrate; a front-surface-electrode shape forming step of forming a paste material containing silver in a front-surface electrode shape on the reflection prevention film; a front-surface-electrode forming step of forming a front surface electrode that is contacted to the impurity diffusion layer by sintering the silicon substrate; a back-surface-electrode shape forming step of forming a paste material containing a metal as a back-surface electrode shape, on the second principal surface of the silicon substrate; and a back-surface electrode forming step of forming a back surface electrode by melting a metal in the paste material by irradiating laser light onto a forming position of the back surface electrode and by solidifying the molten metal.

Advantageous Effects of Invention

According to the present invention, both a front surface electrode and a back surface electrode can obtain a low resistance because sintering of the front surface electrode and formation of the back surface electrode are performed by separate processes and because respective conditions are optimized. Further, because an alloy with silicon is formed by melting the back surface electrodes by laser light, the back surface electrodes are not easily peeled off unlike conventional back surface electrodes, and this contributes to a long life of the photovoltaic device. Furthermore, even when the thickness of a silicon substrate becomes small, a recoupling speed can be suppressed to low because an SiONH film is formed on both front and back surfaces. In addition, because a metal film of a reflection rate higher than that of aluminum is formed on the back surface of the silicon substrate on which the back surface electrodes are formed, it is possible to achieve the BSR effect and to increase the power generation efficiency.

BRIEF DESCRIPTION OF DRAWINGS

FIG. 1-1 is a plan view schematically depicting an example of an entire configuration of a solar battery according to a first embodiment of the present invention.

FIG. 1-2 is a bottom view schematically depicting an example of an entire configuration of the solar battery according to the first embodiment of the present invention.

FIG. 1-3 is an A-A cross-section of FIG. 1-2.

FIG. 3-1 is a partial cross-sectional view schematically depicting an example of a method for manufacturing a solar battery according to the first embodiment of the present invention (part 1).

FIG. 3-2 is a partial cross-sectional view schematically depicting an example of the method for manufacturing a solar battery according to the first embodiment of the present invention (part 2).

FIG. 3-3 is a partial cross-sectional view schematically depicting an example of the method for manufacturing a solar battery according to the first embodiment of the present invention (part 3).

FIG. 3-4 is a partial cross-sectional view schematically depicting an example of the method for manufacturing a solar battery according to the first embodiment of the present invention (part 4).

FIG. 3-5 is a partial cross-sectional view schematically depicting an example of the method for manufacturing a solar battery according to the first embodiment of the present invention (part 5).

FIG. 3-6 is a partial cross-sectional view schematically depicting an example of the method for manufacturing a solar battery according to the first embodiment of the present invention (part 6).

FIG. 3-7 is a partial cross-sectional view schematically depicting an example of the method for manufacturing a solar battery according to the first embodiment of the present invention (part 7).

FIG. 3-8 is a partial cross-sectional view schematically depicting an example of the method for manufacturing a solar battery according to the first embodiment of the present invention (part 8).

DESCRIPTION OF EMBODIMENTS

Exemplary embodiments of a photovoltaic device and a method for manufacturing the same according to the present invention will be explained below in detail with reference to the accompanying drawings. In the following embodiments, a solar battery is exemplified as the photovoltaic device for explanations; however, the present invention is not limited to these embodiments. In addition, cross-sectional views of the solar battery explained in the following embodiments are only schematic, and the relationship between thickness and width, the ratio of thickness of each layer or the like shown in the drawings are different from actual products.

First Embodiment

Figure 2:
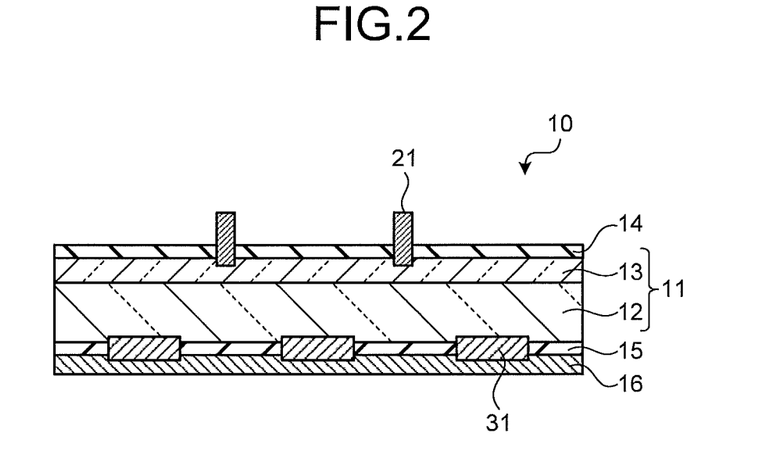
FIG. 2 is a partially-enlarged cross-sectional view of a periphery of a grid electrode of the solar battery.

FIGS. 1-1 to 1-3 schematically depict an example of an entire configuration of a solar battery according to a first embodiment of the present invention, where FIG. 1-1 is a plan view of the solar battery, FIG. 1-2 is a back view of the solar battery, and FIG. 1-3 is an A-A cross-section of FIG. 1-2. FIG. 2 is a partially-enlarged cross-sectional view of a periphery of a grid electrode of the solar battery shown in FIGS. 1-1 to 1-3.

As shown in FIG. 1-1 to FIG. 2, a solar battery 10 is provided with a photovoltaic conversion layer 11 that includes a p-type silicon substrate (hereinafter, also simply "silicon substrate") 12 as a semiconductor substrate and an n-type diffusion layer 13 having diffused thereon an n-type impurity such as P formed on a surface at a principal surface (a light receiving surface) side of the p-type silicon substrate 12.

At the light-receiving surface side of the photovoltaic conversion layer 11, there are provided: a reflection prevention film 14 made of an SiONH film that prevents reflection of light incident to the light receiving surface of the photovoltaic conversion layer 11 and that compensates for a defect of the light-receiving surface side of the silicon substrate 12; a plurality of comb-shaped grid electrodes 21 made of silver or the like that are provided in parallel at a predetermined pitch on the light receiving surface to locally collect electricity generated by the photovoltaic conversion layer 11; and bus electrodes 22 made of silver or the like that are provided substantially orthogonal to the grid electrodes 21 to extract electricity collected by the grid electrodes 21. The grid electrodes 21 and the bus electrodes 22 are contacted to the n-type diffusion layer 13 by penetrating through the reflection prevention film 14. Incidentally a texture structure that confines light incident to the photovoltaic conversion layer 11 into the photovoltaic conversion layer 11 can be formed at the light-receiving surface side of the photovoltaic conversion layer 11. In the following explanations, the grid electrodes 21 and the bus electrodes 22 are collectively referred to as "front surface electrode 20".

A back-surface side of the photovoltaic conversion layer 11 includes: a back-surface passivation film 15 made of an SiONH film that compensates for a defect of a back-surface side of the silicon substrate 12 and suppresses back surface recoupling; a plurality of comb-shaped back-surface current-collection electrodes 31 that are provided in parallel at a predetermined pitch on the back surface in order to collect electricity generated by the photovoltaic conversion layer 11; and back-surface extraction electrodes 32 that are provided substantially orthogonal or crossing at right angle to the back-surface current-collection electrodes 31 in order to extract electricity generated in the back-surface current-collection electrodes 31. The back-surface current-collection electrodes 31 and the back-surface extraction electrodes 32 are contacted to the silicon substrate 12 by penetrating through the back-surface passivation film 15. The back-surface current-collection electrodes 31 and the back-surface extraction electrodes 32 are configured by an Al—Si molten/solidified layer made of an alloy that is formed by melting and solidifying Al and Si. The back-surface current-collection electrodes 31 and the back-surface extraction electrodes 32 have a BSF layer having Al introduced into the silicon substrate 12 as a p-type impurity near or interface or a junction electric field with the silicon substrate 12. Further, on the entire surface of the photovoltaic conversion layer 11 on which the back-surface passivation film 15, the back-surface current-collection electrodes 31, and the back-surface extraction electrodes 32 are formed, there is formed a back-surface-reflection metal film 16. The back-surface-reflection metal film 16 contains at least one of metals such as Ag, Au, Pt, Pd, Ti, Cu, and Sn having a higher reflection rate of light than that of Al within a wavelength range of 800 to 1,200 nanometers, and reflecting infrared rays near this wavelength range to a side of the photovoltaic conversion layer 11 again among the sunlight transmitted through the photovoltaic conversion layer 11. In the following explanations, the back-surface current-collection electrodes 31 and the back-surface extraction electrodes 32 are collectively referred to as "back surface electrode 30".

In the solar battery 10 having the configuration described above, holes and electrons are generated when sunlight is irradiated from the light-receiving surface side of the solar battery 10 onto a pn-junction surface (a junction surface between the p-type silicon substrate 12 and the n-type diffusion layer 13). The generated electrons are moved toward the n-type diffusion layer 13, and the generated holes are moved toward the back-surface side of the silicon substrate 12 by an electric field near the pn-junction surface. With this configuration, electrons are excessively generated in the n-type diffusion layer 13, and then holes are excessively generated at the back surface side of the silicon substrate 12. Consequently, photovoltaic power is generated. The photovoltaic power is generated in a direction to bias the pn-junction to a forward direction, and thus the front surface electrode 20 that is connected to the n-type diffusion layer 13 becomes a minus electrode; the back surface electrode 30 that is connected to the back surface of the silicon substrate 12 becomes a plus electrode; and a current flows to an external circuit which is not shown.

Light incident to the solar battery 10 and is transmitted to the back surface side of the silicon substrate 12 without contributing to a photovoltaic conversion, that is, mainly infrared rays having a wavelength equal to or larger than 800 nanometers, are efficiently reflected to the photovoltaic conversion layer 11 side by the back surface electrode 30 and the back-surface-reflection metal film 16. With this configuration, the proportion of reflection light that is photovoltaically converted by the photovoltaic conversion layer 11 can be increased.

A method for manufacturing the solar battery 10 having the configuration described above is explained next. FIGS. 3-1 to 3-8 are partial cross-sectional views schematically depicting an example of a method for manufacturing a solar battery according to the first embodiment of the present invention. The method for manufacturing the solar battery 10 is explained below with reference to cross-sectional views corresponding to FIG. 2.

Figure 31:
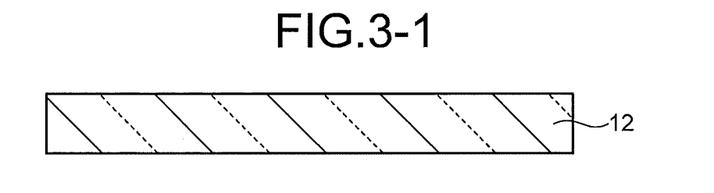

First, for example, the p-type silicon substrate 12 of a single crystal or a polycrystal that is thinner than 160 to 200 micrometers, is prepared (FIG. 3-1). In many cases, a direct slice from an ingot that is manufactured by a pulling method or by a casting method is used for a monocrystalline silicon substrate or a polycrystalline silicon substrate. In this case, in order to remove damage of a substrate front surface due to a scratch by a wire saw and the like used for slicing and in order to remove stains in a wafer slicing process; the substrate front surface is etched for about 10 to 20 micrometers by using an alkali aqueous solution such as a potassium hydroxide aqueous solution and a sodium hydroxide aqueous solution or a mixed liquid of hydrofluoric acid and nitric acid. In addition, in order to remove a heavy metal such as iron adhered to the substrate front surface, a process of cleaning by a mixed liquid of hydrochloric acid and hydrogen peroxide may be added. Further, a texture structure (a fine concavo-convex structure) as a reflection prevention structure may be formed by using an alkali aqueous solution such as a potassium hydroxide aqueous solution and a sodium hydroxide aqueous solution.

Figure 32:
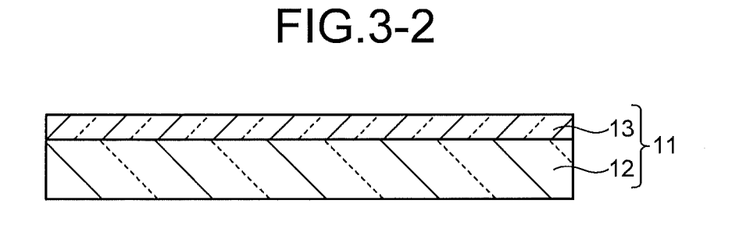

Next, the n-type diffusion layer 13 is formed at only the light-receiving surface side of the silicon substrate 12 to form a pn-junction on the p-type silicon substrate 12 (FIG. 3-2). For example, by performing a heat treatment at 800° C. for about 10 minutes by using phosphorous oxychloride ($POCl_3$) as a diffusion source of P (phosphorus) as an n-type impurity; the n-type diffusion layer 13 having P (phosphorus) diffused thereon and having a conductivity inverted, is formed on the front surface of the p-type silicon substrate 12. Thereafter, the n-type diffusion layer 13 formed on a surface other than that at the light-receiving surface side of the silicon substrate 12 is removed by a method such as etching.

Figure 33:
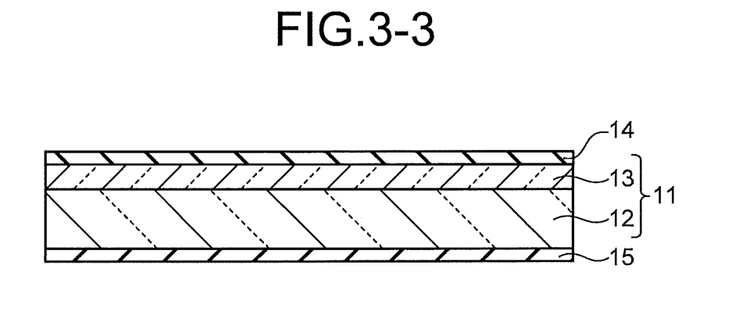

Next, the reflection prevention film 14 made of an SiONH film is formed on the n-type diffusion layer 13 by using silane or ammonium as a main raw material gas by a CVD method. Because the surface reflection rate of incident light to the solar battery 10, is reduced by the SiONH film, a generated current by photovoltaic conversion can be substantially increased. The reflection prevention film 14 to be formed, has a refractive index of 2.1 and a thickness of 75 nanometers, for example. On the back surface of the silicon substrate 12, the back-surface passivation film 15 made of an SiONH film, is also formed by using silane or ammonium as a main raw material gas by the CVD method (FIG. 3-3).

Figure 34:
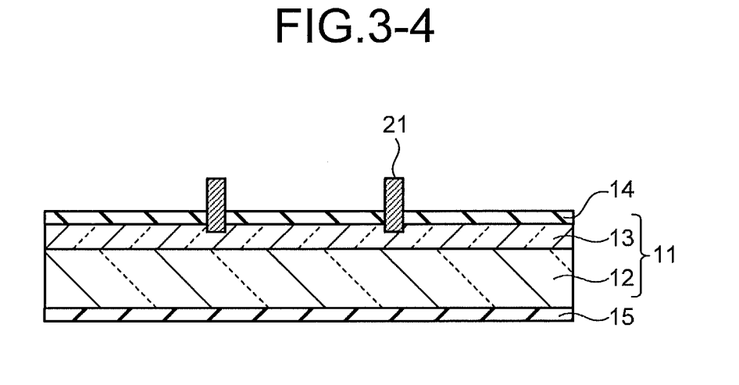

Thereafter, by a screen printing method, on the reflection prevention film 14, the front surface electrode 20 is formed, by coating and drying a silver paste for the front surface containing Ag (silver) that becomes the front surface electrode 20, such that the silver paste becomes in a shape of the grid electrodes 21 and the bus electrodes 22; and by sintering in a sintering condition that is optimum for the front surface electrode 20 (FIG. 3-4). At this time, the silver paste for the front surface that is configured by a glass component and a silver frit; melts the SiONH film as the reflection prevention film 14; and penetrates through (fire-through) the SiONH film during sintering; and becomes the front surface electrode 20 that can be electrically contacted to the n-type diffusion layer 13. Further, by this sintering, H (hydrogen) in the SiONH film that constitutes the reflection prevention film 14 on the front surface of the photovoltaic conversion layer 11 and the back-surface passivation film 15 on the back surface of the photovoltaic conversion layer 11; is diffused onto the silicon substrate 12; and compensates for a defect within the silicon substrate 12. With this configuration, recoupling near the front surface and the back surface of the silicon substrate 12 during an operation of the solar battery 10, can be suppressed.

Figure 12:
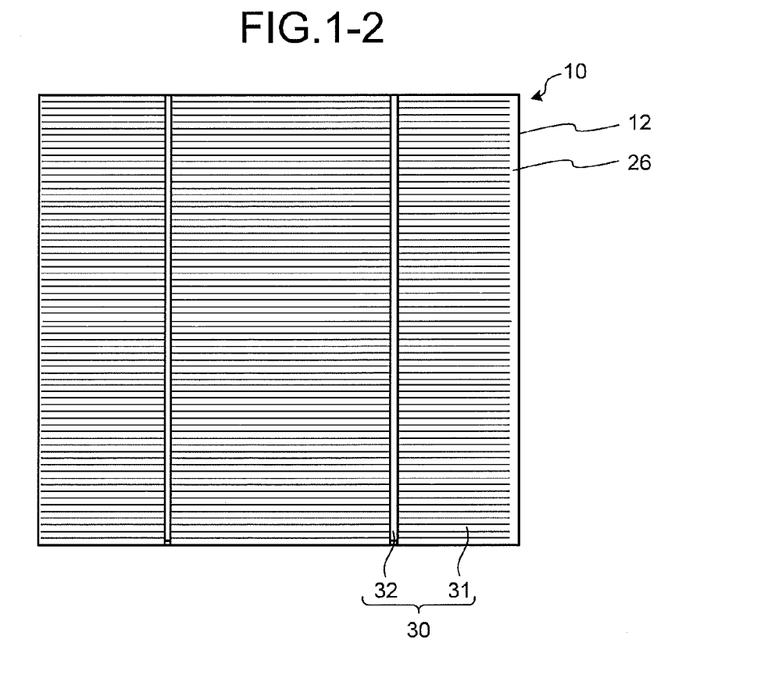
Figure 13:
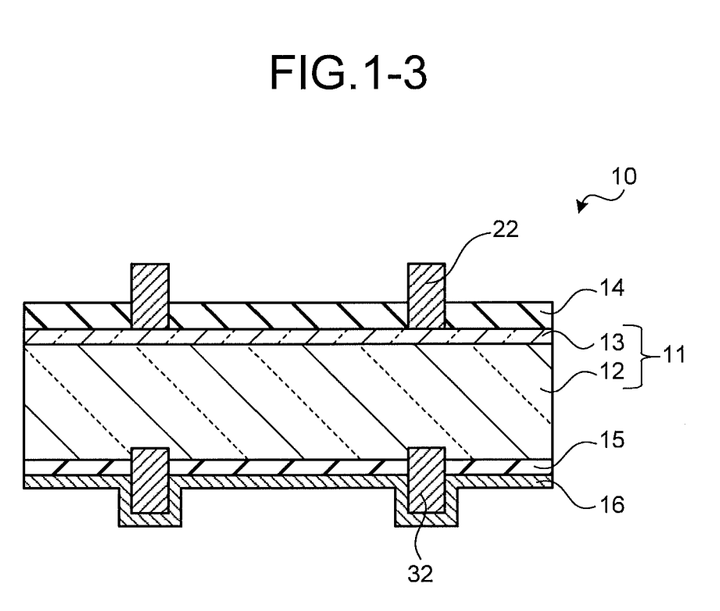
Figure 35:
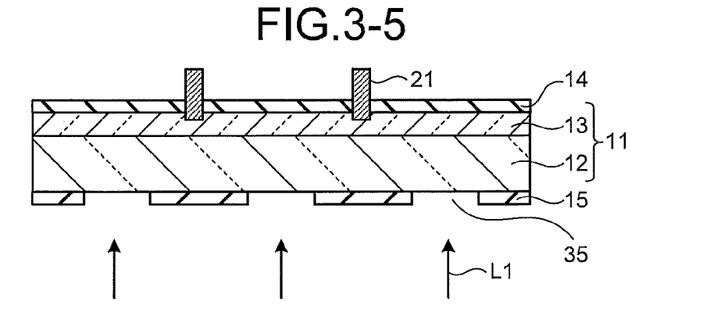

Next, a laser light L1 is irradiated onto predetermined positions on the back-surface passivation film 15 to evaporate the back-surface passivation film 15, thereby forming openings 35 (FIG. 3-5). These openings 35 are patterned in a shape of the back-surface current-collection electrodes 31 and the back-surface extraction electrodes 32 as shown in FIG. 1-2, for example. When it is assumed that the wavelength of the laser light L1 is 355 nanometers and its energy is 3 mJ/cm$^2$, only the back-surface passivation film 15 (the SiONH film) can be evaporated in a less-damaged state of the silicon substrate 12.

Figure 36:
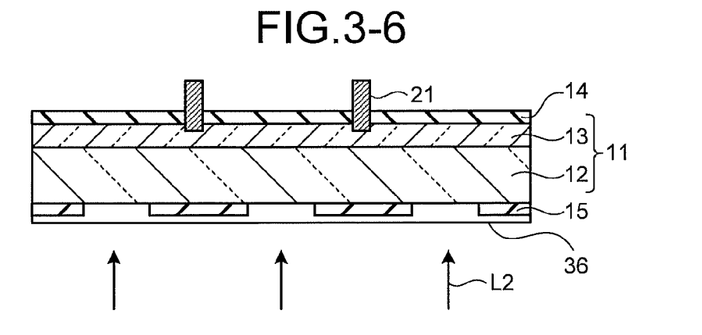
Figure 37:
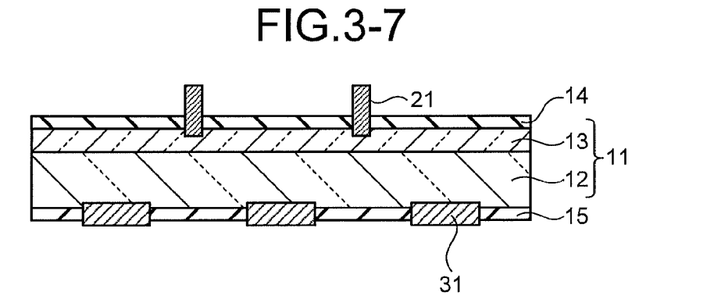
Figure 38:
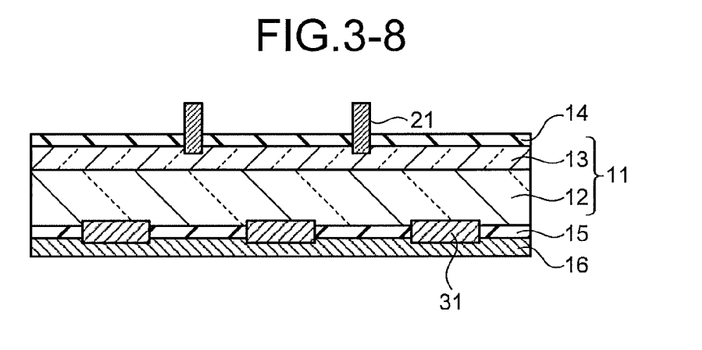

An aluminum paste 36 for the back surface containing Al (aluminum) is printed at necessary positions on the back-surface passivation film 15 on which the openings 35 are formed, by the screen printing method, for example, and the printed paste is dried. Thereafter, a laser light L2 is irradiated onto corresponding positions where the openings 35 are formed, in a similar manner to that of forming the openings 35 (FIG. 3-6). By this irradiation of the laser light L2, Al within the openings 35 is molten and solidified, thereby forming the back surface electrode 30 that consists of an Al—Si molten/solidified layer, with the silicon substrate 12 at a base. At a solidified position in the Al—Si molten/solidified layer near the silicon substrate 12, Al—Si partially becomes a BSF layer. The aluminum paste 36 for the back surface that is not required is removed by an organic solvent such as acetone or by washing with water (FIG. 3-7).

If a state shown in FIG. 3-7 is kept, because the silicon substrate 12 is thin, a part of sunlight incident from the front surface is not absorbed but is transmitted to the back surface side. The light transmitted to the back surface side is mainly infrared rays having a wavelength of 800 nanometers or more. By only the Al—Si molten/solidified layer (the back surface electrode 30) that locally covers the back surface of the silicon substrate 12 as shown in FIG. 3-7, the light that reaches the back surface side cannot be effectively reflected to the photovoltaic conversion layer 11 side. Therefore, in order to increase the back surface reflection (BSR) effect, the back-surface-reflection metal film 16 is formed on the back-surface passivation film 15 on which the back surface electrode 30 is formed, by an evaporation method or a sputtering method by using one or more metals among those having higher reflection rates than that of Al, such as Ag, Au (gold), Pt (platinum), Pd (palladium), Ti (titanium), Cu (copper), and Sn (tin) (FIG. 3-8). The solar battery 10 having the structure shown in FIG. 1-1 to FIG. 2 is manufactured by the processes described above.

In the above explanations, in FIG. 3-6, after the openings 35 are provided by irradiating the laser light L1 onto the back-surface passivation film 15, the aluminum paste for the back surface is printed at predetermined positions on the back surface, and thereafter the laser light L2 is irradiated onto the openings 35 again. Alternatively, it can be arranged such that the aluminum paste for the back surface is printed in a predetermined shape on the back-surface passivation film 15, and thereafter laser light is irradiated onto predetermined positions, and the back surface electrode 30 made of an alloy of Al and Si is formed at the irradiated positions. However, when the method described with reference to FIG. 3-6 is used, that is, when the aluminum paste for the back surface is coated onto the openings 35 and the laser light L2 is irradiated, after the openings 35 are provided on the back-surface passivation film 15; the reaction between Al that is molten by laser light and the back-surface passivation film 15 (the SiONH film) can be controlled, and the size of the back surface electrode 30 is substantially defined by a size of the openings 35 formed on the back-surface passivation film 15. Therefore, the back surface electrode 30 of a stable size can be formed.

According to the solar battery 10 formed in a manner described above, its cell conversion efficiency is improved by 2% or more, as compared with that of conventional solar batteries formed by the following processes, which are a silver paste for the front surface is printed on the front surface of the photovoltaic conversion layer 11; an aluminum paste for the back surface is printed on the substantially entire back surface; a silver paste for the back surface is printed at other positions on the back surface; and thereafter the front surface electrode 20 and the back surface electrode 30 are simultaneously sintered.

According to the first embodiment, the reflection prevention film 14 for the front surface and the back-surface passivation film 15 for the back surface are formed by the SiONH film; and the Al—Si molten/solidified layer is formed as the back surface electrode 30. Also, the entire back surface is covered by at least one type of metals selected from a group of Ag, Au, Pt, Pd, Ti, Cu, and Sn having reflection rates of infrared rays of a wavelength near 800 to 1,200 nanometers. Therefore, recoupling near the back surface of the silicon substrate 12 can be suppressed, and light transmitted through the photovoltaic conversion layer 11 can be again efficiently reflected to the photovoltaic conversion layer 11 side. As a result, power can be efficiently generated in the photovoltaic conversion layer 11; even when the thickness of the silicon substrate 12 (in the photovoltaic conversion layer 11) becomes smaller than a conventional thickness, particularly when the thickness of the silicon substrate 12 (in the photovoltaic conversion layer 11) is equal to or smaller than 160 to 200 micrometers.

Because a sintering process of the front surface electrode 20 and a forming process of the back surface electrode 30 are set as different processes; forming conditions of electrodes by these processes can be optimized; and low-resistance electrodes that are suitable for the solar battery 10 can be obtained. Further, because electrodes with a resistance that is suitable for the solar battery 10 to be manufactured can be obtained; a loss due to an increased resistance value can be suppressed, and generated electricity can be efficiently obtained.

In the first embodiment, because sintering of the back surface electrode 30 is not performed in the entirety of the silicon substrate 12 but performed in only regions where the laser light L2 is irradiated; the peeling-off tendency of electrodes at a cooling time can be prevented, as compared with a conventional example where the back surface electrode is formed by sintering; both an aluminum paste that is formed on the substantially entire back surface of the semiconductor substrate and a silver paste that is formed at positions where the aluminum electrodes are not formed. As a result, the solar battery has a long life as compared with those manufactured by conventional manufacturing methods.

Second Embodiment

Figure 4:
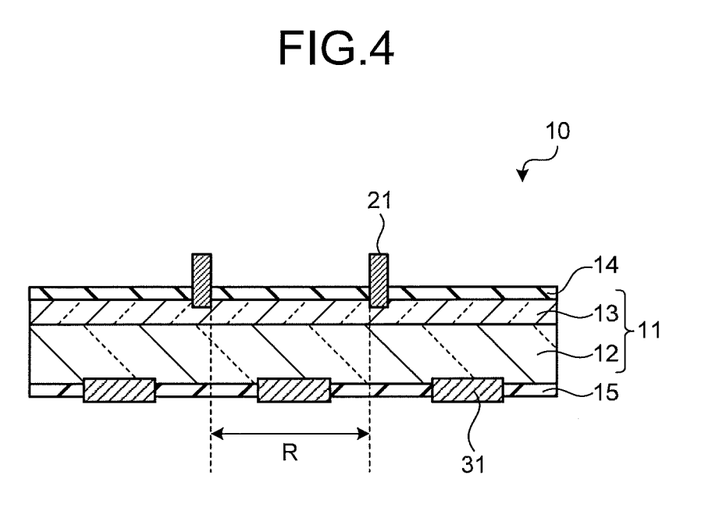
FIG. 4 is a partial cross-sectional view schematically depicting an example of a solar battery according to a second embodiment.
Figure 11:
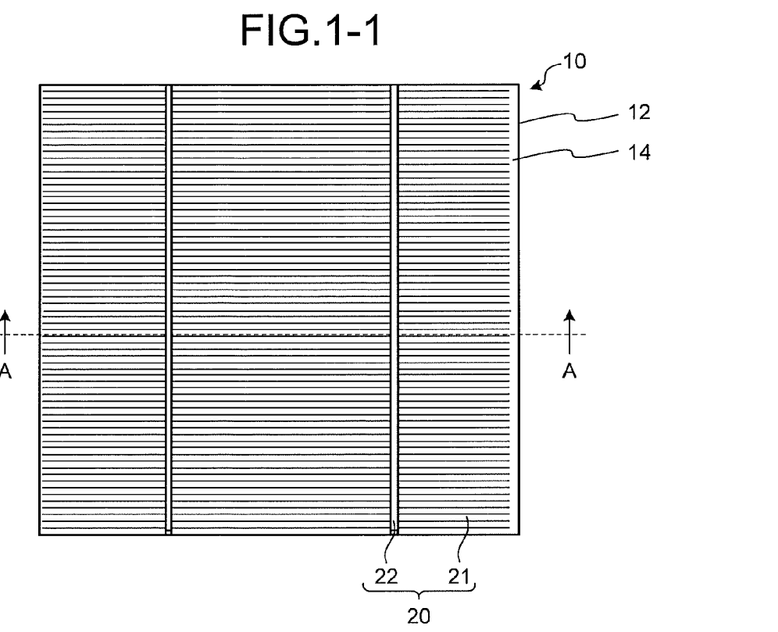

FIG. 4 is a partial cross-sectional view schematically depicting an example of a solar battery according to a second embodiment. As shown in FIG. 4, in the solar battery 10 according to the second embodiment, the back surface electrode 30 includes; the back-surface current-collection electrodes 31 formed in a grid shape; and the back-surface extraction electrodes 32 that are formed to connect the back-surface current-collection electrodes 31, in a similar manner to that in the first embodiment. However, unlike the first embodiment, the back-surface-reflection metal film 16 is not provided. Further, as shown in FIG. 4, forming positions of the back-surface current-collection electrode 31 are at positions in regions R between the grid electrode 21 and the grid electrode 21 that are adjacent to each other, such that the forming positions of the back-surface current-collection electrodes 31 are not superimposed with forming positions of the grid electrodes 21 that are formed on the front surface.

For example, in the solar battery 10 having a size of 100 to 200 mm☐, the grid electrode 21 that is formed at the light-receiving surface side has a width of 100 micrometers and the pitch of the grid electrodes 21 is 1.5 to 3 micrometers in usual cases. Therefore, it is preferable that the back-surface current-collection electrodes 31 according to the second embodiment, are designed to have a width of 0.5 to 1.5 millimeters and in the same pitch as the pitch of the grid electrodes 21, such that the back-surface current-collection electrodes 31 fill gaps between the grid electrodes 21, when the grid electrodes 21 are projected onto the back surface side of the silicon substrate 12.

When the back-surface current-collection electrodes 31 are arranged by shifting forming positions of the back-surface current-collection electrodes 31 from forming positions of the grid electrodes 21 on the light receiving surface in this way; light transmitted to the back surface of the photovoltaic conversion layer 11 without being photovoltaically converted, is reflected to the photovoltaic conversion layer 11 side by the back-surface current-collection electrodes 31 that are present between the forming positions of the grid electrodes 21 at the light receiving surface side.

According to the second embodiment, the back-surface current-collection electrodes 31 of a comb shape on the back surface are arranged by shifting the back-surface current-collection electrodes 31 from forming positions of the grid electrodes 21 of a comb shape at the light receiving surface side. Therefore, even when the back-surface-reflection metal film 16 is not formed, light is reflected to the photovoltaic conversion layer 11 side by the back-surface current-collection electrodes 31 that are present between the forming positions of the grid electrodes 21 at the light receiving surface side. Therefore, electric power can be efficiently generated in the photovoltaic conversion layer 11.

Because the back-surface-reflection metal film 16 made of at least one type of metals selected from the group of Ag, Au, Pt, Pd, Ti, Cu, and Sn, is not formed, a manufacturing process can be simplified as compared with the first embodiment. Because the metals mentioned above are not used, the manufacturing cost can be reduced.

INDUSTRIAL APPLICABILITY

As described above, the photovoltaic device according to the present invention is useful for a solar battery having its silicon substrate formed thinner than conventional ones.

REFERENCE SIGNS LIST

10 SOLAR BATTERY
11 PHOTOVOLTAIC CONVERSION LAYER
12 P-TYPE SILICON SUBSTRATE
13 N-TYPE DIFFUSION LAYER
14 REFLECTION PREVENTION FILM
15 BACK-SURFACE PASSIVATION FILM
16 BACK-SURFACE-REFLECTION METAL FILM
20 FRONT SURFACE ELECTRODE
21 GRID ELECTRODE
22 BUS ELECTRODE
30 BACK SURFACE ELECTRODE
31 BACK-SURFACE CURRENT-COLLECTION ELECTRODE
32 BACK-SURFACE EXTRACTION ELECTRODE
35 OPENING

The invention claimed is:

1. A method for manufacturing a photovoltaic device comprising:
an impurity-diffusion-layer forming step of forming an impurity diffusion layer having a second conductivity type impurity diffused thereon at a first principal surface side of a first conductivity type silicon substrate;
a reflection-prevention-film forming step of forming a reflection prevention film on the impurity diffusion layer;
a back-surface passivation-film forming step of forming a back-surface passivation film made of an SiONH film on a second principal surface of the silicon substrate;
a front-surface-electrode shape forming step of forming a paste material containing silver in a front-surface electrode shape on the reflection prevention film;
a front-surface-electrode forming step of forming a front surface electrode that is contacted to the impurity diffusion layer by sintering the silicon substrate;
a back-surface-electrode shape forming step of forming a paste material containing a metal as a back-surface electrode shape, on the second principal surface of the silicon substrate; and
a back-surface electrode forming step of forming a back surface electrode by melting a metal in the paste material by irradiating laser light onto a forming position of the back surface electrode and by solidifying the molten metal;
wherein the back-surface-electrode shape forming step includes:
a step of providing an opening of the back-surface electrode shape on the back-surface passivation film; and
a step of forming the paste material containing the metal on the opening; and
the back-surface electrode forming step includes:
a step of forming the back-surface electrode on the opening by melting the metal in the paste material by irradiating laser light onto a forming position of the opening and by solidifying the molten metal, to form the back-surface electrode consisting of an Al—Si layer with the silicon substrate at a base.

2. The method for manufacturing a photovoltaic device according to claim 1, further comprising, subsequent to the back-surface electrode forming step, a back-surface-reflection metal film forming step of forming a back-surface-reflection metal film made of a metal of which a reflection rate of infrared rays within a wavelength range of 800 to 1,200 nanometers is higher than that of aluminum on the back-surface passivation film on which the back surface electrode has been formed.

3. The method for manufacturing a photovoltaic device according to claim 2, wherein the back-surface-reflection metal film is formed by at least one type of metals selected from a group of Ag, Au, Pt, Pd, Ti, Cu, and Sn.

4. The method for manufacturing a photovoltaic device according to claim 1, wherein at the front-surface-electrode shape forming step, a pattern of the front surface electrode is formed on the impurity diffusion layer, the pattern of the front surface electrode including both a plurality of grid electrode patterns that are arranged in parallel while extending in a first direction and a bus electrode pattern that connects the grid electrode patterns while extending in a second direction, and at the back-surface-electrode shape forming step, a back-surface electrode pattern is formed on the second principal surface of the silicon substrate, the back-surface electrode pattern including both a plurality of back-surface current-collection-electrode patterns that are arranged in parallel while extending in the first direction and a back-surface extraction electrode pattern that connects the back-surface current-collection-electrode patterns while extending in the second direction; and the back-surface current-collection-electrode patterns are formed between forming positions of the grid electrode patterns when the forming positions of the grid electrode patterns are projected onto the second principal surface.

5. The method for manufacturing a photovoltaic device according to claim 1, wherein the paste material used at the back-surface-electrode shape forming step is a paste material containing aluminum as a main component.

\* \* \* \* \*